(12) United States Patent
Kim et al.

(10) Patent No.: US 7,571,375 B2
(45) Date of Patent: Aug. 4, 2009

(54) METHODS FOR MESSAGE PASSING DECODING USING SIMULTANEOUS MEMORY ACCESSES

(75) Inventors: Yong-Woon Kim, Gyeonggi-do (KR); Dong-Joo Kim, Seoul (KR); Jae-Won Seo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 613 days.

(21) Appl. No.: 11/258,459

(22) Filed: Oct. 25, 2005

(65) Prior Publication Data

US 2006/0274772 A1    Dec. 7, 2006

(30) Foreign Application Priority Data

Jun. 1, 2005  (KR)  ............... 10-2005-0046524

(51) Int. Cl.
    *H03M 13/03*  (2006.01)
(52) U.S. Cl. ............ 714/786; 714/752; 714/799; 375/262; 375/341
(58) Field of Classification Search ......... 370/369–385; 398/30–33, 37, 38, 94; 714/752, 786, 799; 375/262, 341
    See application file for complete search history.

(56) References Cited

U.S. PATENT DOCUMENTS

| 7,299,397 | B2 * | 11/2007 | Yokokawa et al. | 714/752 |
| 7,415,079 | B2 * | 8/2008 | Cameron et al. | 375/340 |
| 2005/0240853 | A1 * | 10/2005 | Yokokawa et al. | 714/752 |
| 2005/0278606 | A1 * | 12/2005 | Richardson et al. | 714/760 |

OTHER PUBLICATIONS

Shokrollah, Amin, "LDPC Codes: An Introduction," Digital Fountain, Inc., Fremont, CA, Apr. 2, 2003, 34 pages.

* cited by examiner

*Primary Examiner*—Esaw T Abraham
(74) *Attorney, Agent, or Firm*—Myers Bigel Sibley & Sajovec, P.A.

(57) ABSTRACT

Respective memory locations are assigned for respective edges linking processing nodes of a decoder comprising a plurality of processing nodes. The decoder is applied to a coded input signal to generate a decoded output signal, wherein edge values are iteratively retrieved from and provided to the memory locations such that multiple ones of the memory locations are simultaneously accessed in a processing node operation. The processing nodes may comprise variable nodes and check nodes and the edges comprise edges linking the variable and check nodes. The invention may be embodied as methods, apparatus and computer program products.

17 Claims, 18 Drawing Sheets

METHODS FOR MESSAGE PASSING DECODING USING SIMULTANEOUS MEMORY ACCESSES

CROSS REFERENCE TO RELATED APPLICATION

This application claims priority under 35 USC § 119 to Korean Patent Application No. P2005-0046524, filed Jun. 1, 2005, the disclosure of which is herein incorporated by reference in its entirety.

BACKGROUND OF THE INVENTION

The present invention relates to decoding techniques and, more particularly, to apparatus and methods for decoding using message-passing techniques.

Conventional communications systems commonly use channel coding to reduce data transmission errors. Commonly used channel codes include convolutional and block codes. Commonly used convolutional codes include tail-biting codes, zero-trailing codes, and convolutional turbo codes. Commonly used block codes include Reed-Solomon codes, BCH codes, block turbo codes, and low density parity check (LDPC) codes.

LDPC coding has recently been adopted for use in digital television (DTV) transmission. LDPC codes are linear codes obtained from sparse bipartite graphs including "variable" (or "message") nodes and "check" nodes that are connected by "edges." Such a graph representation may be represented as a matrix. In particular, for a graph with n variable nodes and r check nodes, a binary r×n matrix may be defined wherein a particular entry (i, j) is a "1" if and only if the ith check node is connected to the jth variable node. This matrix is referred to as a parity check matrix. An LDPC code is characterized by a sparse parity check matrix.

Conventional LDPC decoding techniques typically employ iterative "message passing" algorithms. Such algorithms generally involve a series of rounds in which values are passed from variable nodes to check nodes and from check nodes back to variable nodes. Values sent from a variable node typically are computed based on the current value of the variable node and values received from neighboring check nodes.

A subclass of message passing algorithms called belief propagation algorithms are commonly used for LDPC decoding. In these algorithms, messages passed between nodes represent probabilities. In particular, a message passed from a variable node j to a check node i represents the probability that the variable node j has a certain value given the observed value of the variable node j and the values passed to the variable node j in the prior round from check nodes connected to the variable node j other than the check node i. A message passed from the check node i to the variable node j represents the probability that the variable node j has a certain value given the messages passed to the check node i the previous round from variable nodes other than the variable node j.

U.S. Pat. No. 6,539,377 to Blanksby et al describes a block-parallel decoding algorithm using a set of interconnected processing nodes configured in the form of a probability dependency graph, e.g., a bipartite probability dependency graph including variable and check nodes. A single iteration of the decoding process may produce within the variable nodes an update estimate for every bit or symbol in a given block. The decoding process is initiated by sending to each check node connected to a variable node a function $f(Rx_i)$ where $Rx_i$ is the received bit or symbol and $f()$ is a function determined at least in part by the code, such as a threshold function, a linear scaling function or an approximate exponential function. The decoding process includes calculation in parallel at each of the check nodes a function $g()$, e.g., a parity check function, of the input from the variable nodes connected to that check node, and sending to the connected variable nodes the result of these check node computations. The decoding process further includes calculating in parallel at each of the variable nodes a function $h()$, e.g., a majority or averaging function, of the input from the check nodes connected to that variable node, and sending to the connected check nodes the results of these variable node computations. The process may be terminated when all check nodes satisfy a constraint of the code or after a maximum number of iterations. The values of the variable nodes at termination represent an estimate of the transmitted bit or symbol. The set of interconnected processing nodes may be implemented using one or more programmable computation units, each of which may be configured to implement a node or set of nodes.

SUMMARY OF THE INVENTION

Some embodiments of the present invention provide decoding methods. Respective memory locations are assigned for respective edges linking processing nodes of a decoder comprising a plurality of processing nodes. The decoder is applied to a coded input signal to generate a decoded output signal, wherein edge values are iteratively retrieved from and provided to the memory locations such that multiple ones of the memory locations are simultaneously accessed in a processing node operation. Edge value generation for a processing node may include simultaneously reading edge values for the processing node from multiple ones of the memory locations and/or simultaneously writing edge values for the processing node to multiple ones of the memory locations.

In some embodiments of the present invention, the processing nodes comprise variable nodes and check nodes and the edges comprise edges linking the variable and check nodes. In some embodiments, application of the decoder to a coded input signal comprises alternately performing variable and check node operations in respective first and second processors. In further embodiments, application of the decoder to a coded input signal comprises configuring at least one processor to perform a variable node operation, computing variable node output edge values using the at least one processor, reconfiguring the at least one processor to perform a check node operation and computing check node output edge values using the at least one processor. In additional embodiments, a first plurality of memory locations is assigned to variable node-to-check node edges and a second plurality of memory locations is assigned to check node-to-variable node edges. Application of the decoder comprises simultaneously performing variable node and check node operations in respective first and second processors and storing edge values thereby produced in the respective first and second pluralities of memory locations.

In still further embodiments of the present invention, respective simultaneously accessible memory units are assigned to respective groups of the edges such that edge values for a particular processing node may be simultaneously accessed by simultaneously accessing a plurality of the simultaneously accessible memory units. Each of the simultaneously accessible memory units may comprise a plurality of memory locations that are accessed in respective different processing node operations.

In some embodiments, application of the decoder to a coded input signal to generate a decoded output signal may be preceded by receiving a signal from a communications medium and processing the received signal to generate the coded input signal. For example, embodiments of the present invention may be used for decoding coded signals in wireless, wireline, optical and other applications.

According to further embodiments of the present invention, a decoding apparatus includes at least one processor configured to provide a decoder including a plurality of processing nodes and a memory including a plurality of memory locations, respective ones of which are assigned to respective edges linking the processing nodes. The processor and memory are further configured to support retrieval of edge values from and provision of edge values to the memory locations such that multiple ones of the memory locations are simultaneously accessed for a processing node operation. The at least one processor and the memory may be configured to support simultaneous reading of edge values from multiple ones of the memory locations for a processing node operation and/or simultaneous writing of a plurality of edge values to multiple ones of the memory locations for a processing node operation.

The processing nodes may comprise variable nodes and check nodes, and the edge may comprise edges linking the variable and check nodes. The at least one processor may comprise respective first and second processors configured to alternately perform respective variable and check node operations. In some embodiments, the at least one processor may comprise a processor configurable to alternately perform variable node and check node operations.

The memory may include a first plurality of memory locations assigned to variable node-to-check node edges and a second plurality of memory locations assigned to check node-to-variable node edges. The processor may include respective first and second processors configured to simultaneously perform variable node and check node operations and to store edge values thereby produced in the respective first and second pluralities of memory locations.

The memory may include respective simultaneously accessible memory units assigned to respective groups of the edges such that edges values for a particular processing node may be simultaneously accessed by simultaneously accessing a plurality of the simultaneously accessible memory units. Each of the simultaneously accessible memory units may include a plurality of memory locations, and the at least one processor may be configured to access different ones of the plurality of memory locations in a simultaneously accessible memory unit in respective different processing node operations.

Further embodiments of the present invention provide computer program products for decoding a coded signal. A computer program product includes computer program code embodied in a storage medium and including program code configured to define a decoder comprising a plurality of processing nodes, to assign respective memory locations for respective edges linking the processing nodes, and to apply the decoder to a coded input signal to generate a decoded output signal by iteratively retrieving edge values from and providing edge values to the memory locations for operations of the processing nodes such that multiple ones of the memory locations are simultaneously accessed in a processing node operation. The program code may be configured to simultaneously read and/or write edge values for a processing node from multiple ones of the memory locations. The processing nodes may comprise variable nodes and check nodes, and the edges may comprise edges linking the variable and check nodes. The program code may be configured to assign respective simultaneously accessible memory units to respective groups of the edges such that edge values for a particular processing node are simultaneously accessed by simultaneously accessing a plurality of the simultaneously accessible memory units.

In additional embodiments of the present invention, a memory includes a plurality of memory locations, respective ones of which are assigned to respective edges linking processing nodes of a decoder and configured to support retrieval of edge values from and provision of edge values to the memory locations for operations of the processing nodes such that multiple ones of the memory locations are simultaneously accessible for a processing node operation. The memory may include respective simultaneously accessible memory units assigned to respective groups of the edges such that edges values for a particular processing node may be simultaneously accessed by simultaneously accessing a plurality of the simultaneously accessible memory units. Each of the simultaneously accessible memory units may comprise a plurality of memory locations arranged such that a processor may access different ones of the plurality of memory locations in a simultaneously accessible memory unit in respective different processing node operations.

DETAILED DESCRIPTION OF EXEMPLARY EMBODIMENTS

Figure 1:
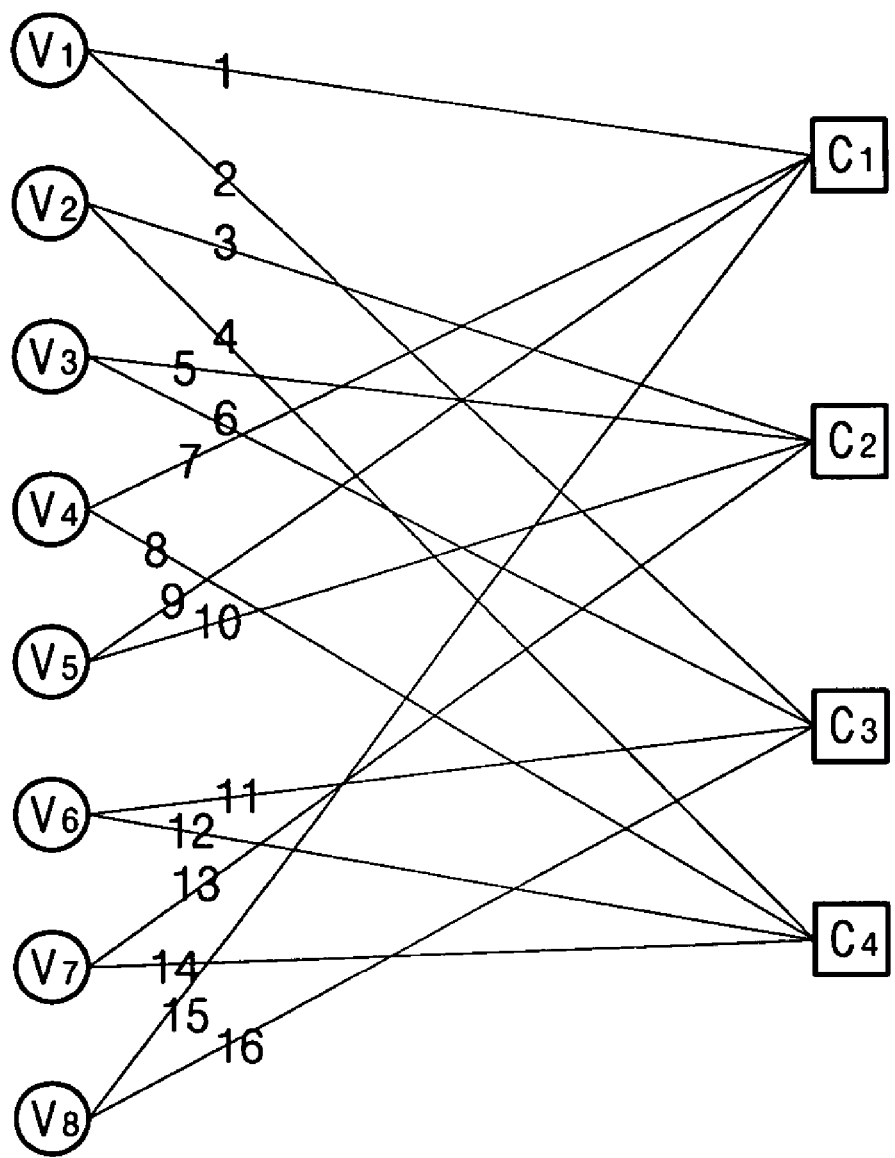
FIGS. 1-3 are diagrams illustrating exemplary bipartite graphs for various codes.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, components may be exaggerated for clarity.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components and/or sections, these elements, components and/or sections should not be limited by these terms. These terms are only used to distinguish one element, component, or section from another element, region or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments of the present invention are described herein with reference to block diagrams and flowchart illustrations, which support methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks. Each block may represent a module, segment, or portion of code, which includes one or more executable instructions for implementing the specified logical function(s). It should also be noted that in other implementations, function(s) noted in the blocks may occur out of the order noted in the figures. For example, two blocks shown in succession may, in fact, be executed substantially concurrently or the blocks may sometimes be executed in the reverse order, depending on the functionality involved.

According to various illustrative embodiments of the present invention, methods, apparatus and computer program products may be provided wherein a coded data, such as a stream of coded data symbols (e.g., bits) generated from a received signal, is decoded using a message-passing computational structure including processing nodes and "edge" values (messages) that pass between the processing nodes. The illustrative embodiments will be described in application to decoding according to codes, such as LDPC codes, that may be described by a message-passing structure having a bipartite configuration including "variable" and "check" nodes. However, it will be appreciated that the present invention is also applicable to decoding operations for codes having other structures.

In some embodiments of the present invention, memory accesses for multiple edges for a processing node operation, for example, an operation involving computation of a set of output edges for a variable or a check node, occur "simultaneously." As used herein, "simultaneous" memory accesses refer to read, write or other memory access operations that at least partially overlap or otherwise coincide in time, such that at least portions of the simultaneous accesses occur in parallel.

Figure 2:
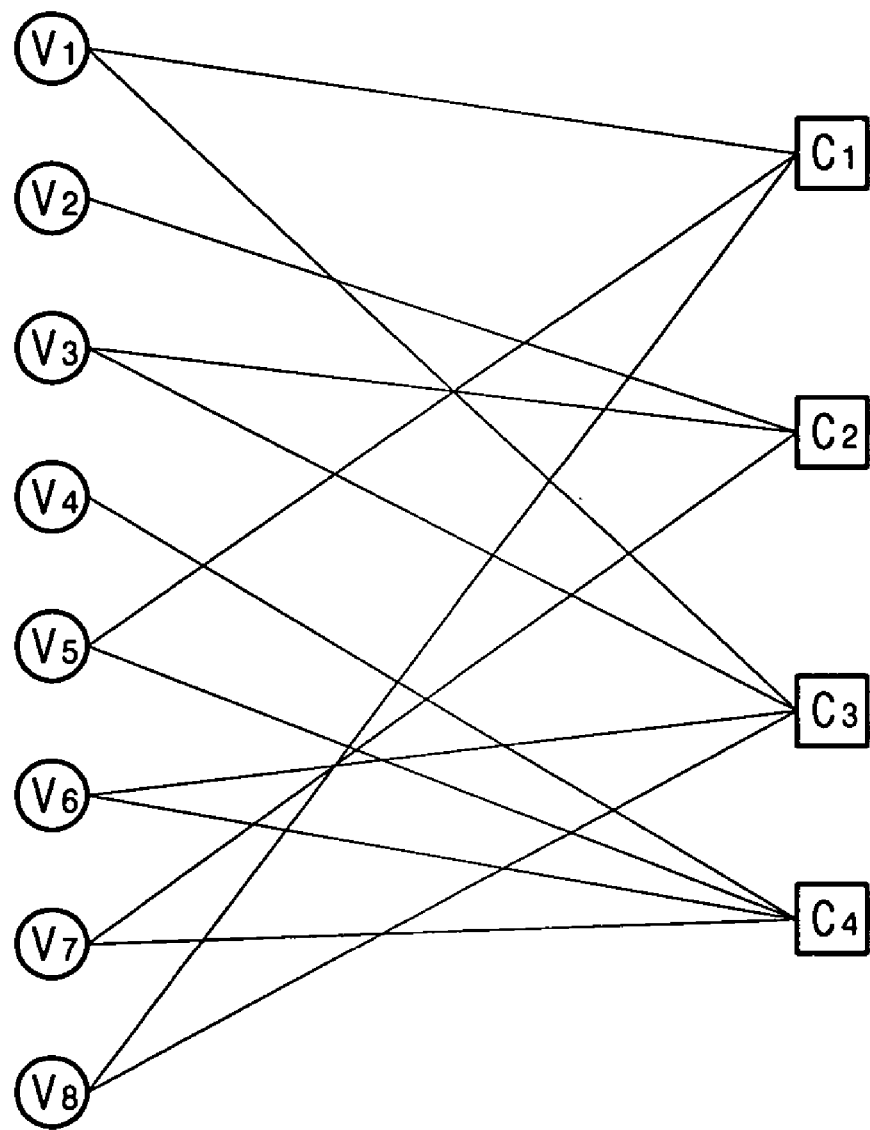
Figure 3:
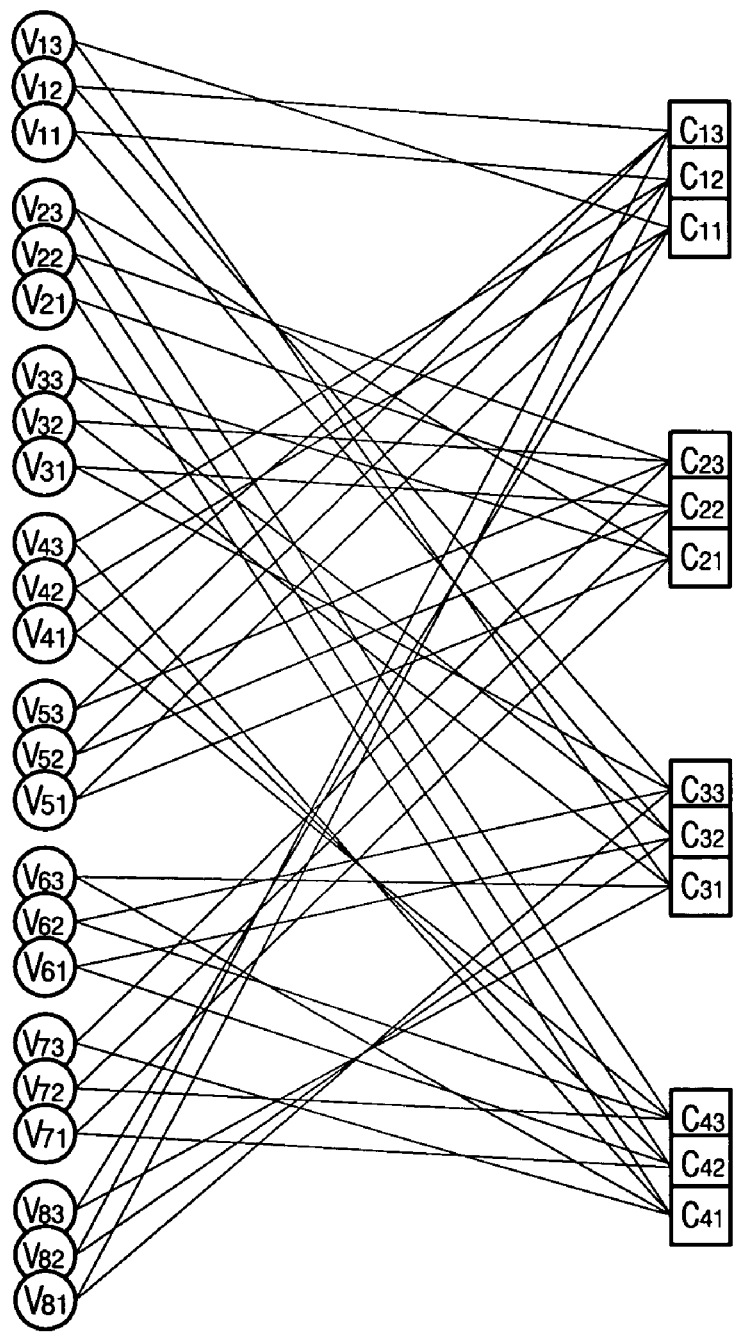

FIGS. 1-3 illustrate bipartite graphs of examples of codes that may be decoded using a bipartite decoding structure according to some embodiments of the present invention. FIG. 1 illustrates a bipartite graph for a regular code having variable nodes $V_1, V_2, \ldots, V_8$, and check nodes $C_1, C_2, \ldots, C_4$. This graph may be described by the corresponding parity check matrix:

$$H = \begin{bmatrix} 1 & 0 & 0 & 1 & 1 & 0 & 0 & 1 \\ 0 & 1 & 1 & 0 & 1 & 0 & 1 & 0 \\ 1 & 0 & 1 & 0 & 0 & 1 & 0 & 1 \\ 0 & 1 & 0 & 1 & 0 & 1 & 1 & 0 \end{bmatrix},$$

wherein the column correspond to the variable nodes $V_1$, $V_2, \ldots, V_8$ and the rows correspond to the check nodes $C_1$, $C_2, \ldots, C_4$. FIG. 2 illustrates a bipartite graph for an irregular code, which may be also described by the parity check matrix:

$$H = \begin{bmatrix} 1 & 0 & 0 & 0 & 1 & 0 & 0 & 1 \\ 0 & 1 & 1 & 0 & 1 & 0 & 1 & 0 \\ 1 & 0 & 1 & 0 & 0 & 1 & 0 & 1 \\ 0 & 0 & 0 & 1 & 0 & 1 & 1 & 0 \end{bmatrix}$$

Finally, FIG. 3 illustrates a bipartite graph for a block LDPC code having a parity check matrix:

$$H = \begin{bmatrix} P^1 & 0 & 0 & P^2 & P^0 & 0 & 0 & P^1 \\ 0 & P^2 & P^1 & 0 & P^0 & 0 & P^0 & 0 \\ P^1 & 0 & P^2 & 0 & 0 & P^1 & 0 & P^2 \\ 0 & P^0 & 0 & P^2 & 0 & P^1 & P^1 & 0 \end{bmatrix},$$

where $$P^1 = \begin{bmatrix} 0 & 1 & 0 \\ 0 & 0 & 1 \\ 1 & 0 & 0 \end{bmatrix},$$

$$P^2 = \begin{bmatrix} 0 & 0 & 1 \\ 1 & 0 & 0 \\ 0 & 1 & 0 \end{bmatrix}, \text{ and}$$

$$P^0 = \begin{bmatrix} 1 & 0 & 0 \\ 0 & 1 & 0 \\ 0 & 0 & 1 \end{bmatrix},$$

where the columns of H correspond to groups of variable nodes $V_{11}, V_{12}, \ldots V_{82}, V_{83}$, and the rows of H correspond to groups of check nodes $C_{11}, C_{12}, \ldots C_{42}, C_{43}$.

Figure 4:
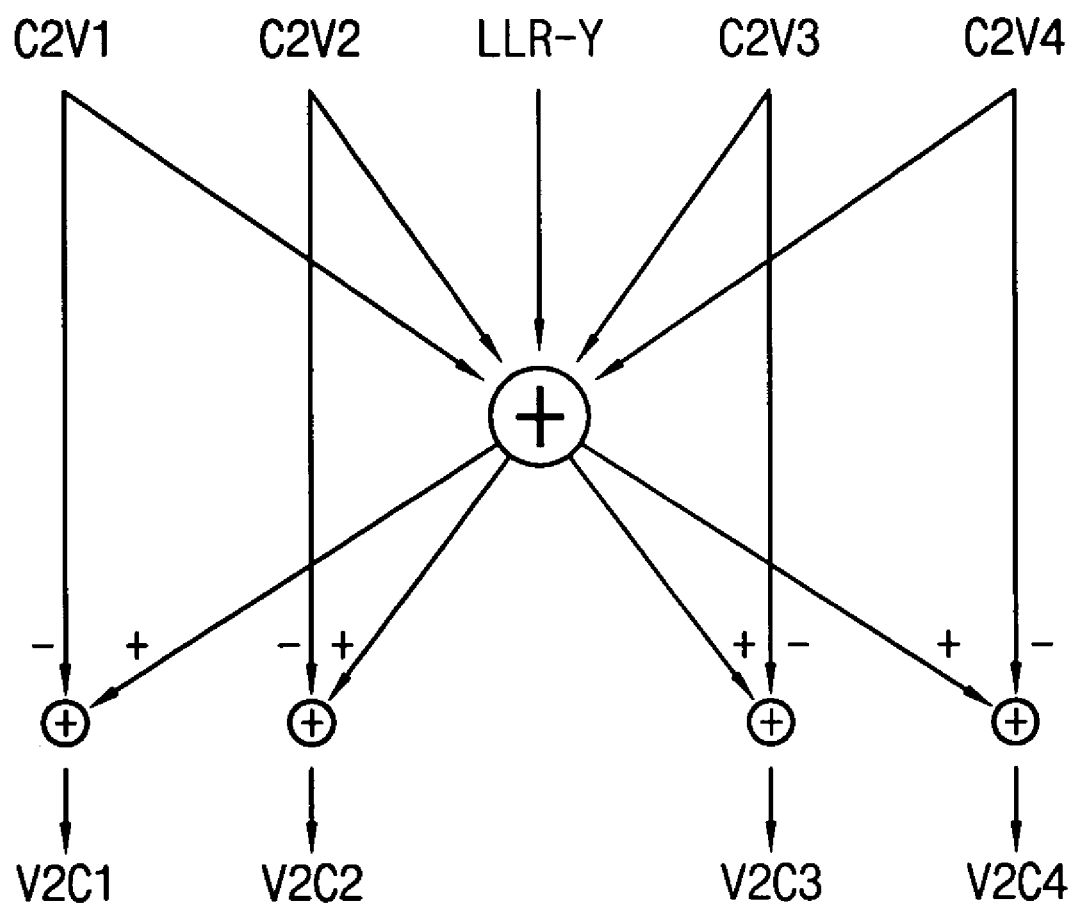
FIG. 4 is a diagram illustrating exemplary variable node computations.

An example of variable node computation for the structure of FIG. 1 is illustrated in FIG. 4. In particular, a channel coded value LLR-Y (e.g., a log-likelihood value) and input edge values C2V1, C2V2, C2V3 and C2V4 from check nodes are summed. The sum produced is selectively combined with the input edge values C2V1, C2V2, C2V3 and C2V4 to produce output edge values V2C1, V2C2, V2C3, and V2C4 for check nodes.

Figure 5:
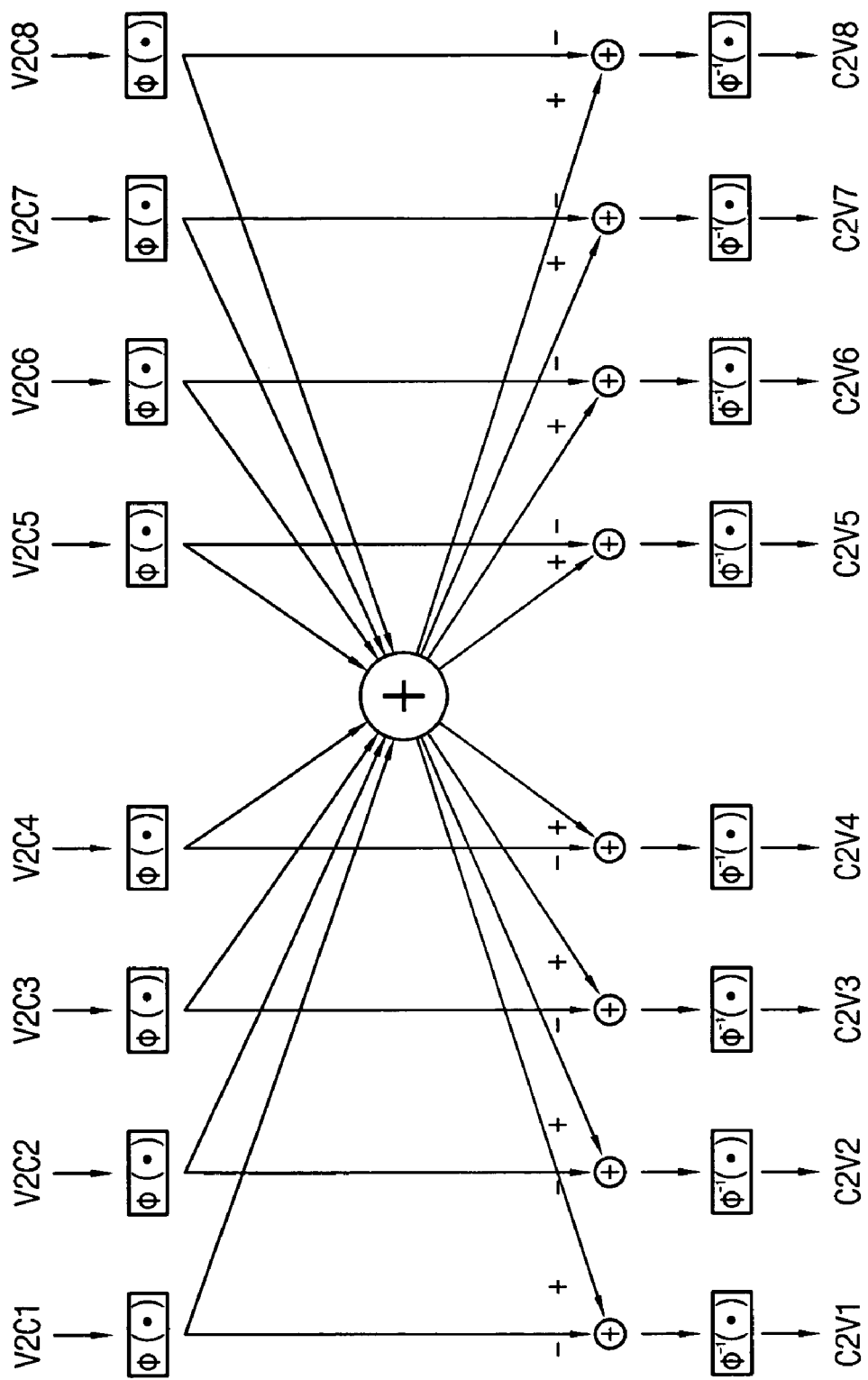
FIGS. 5 and 6 are diagrams illustrating exemplary check node computations.
Figure 6:
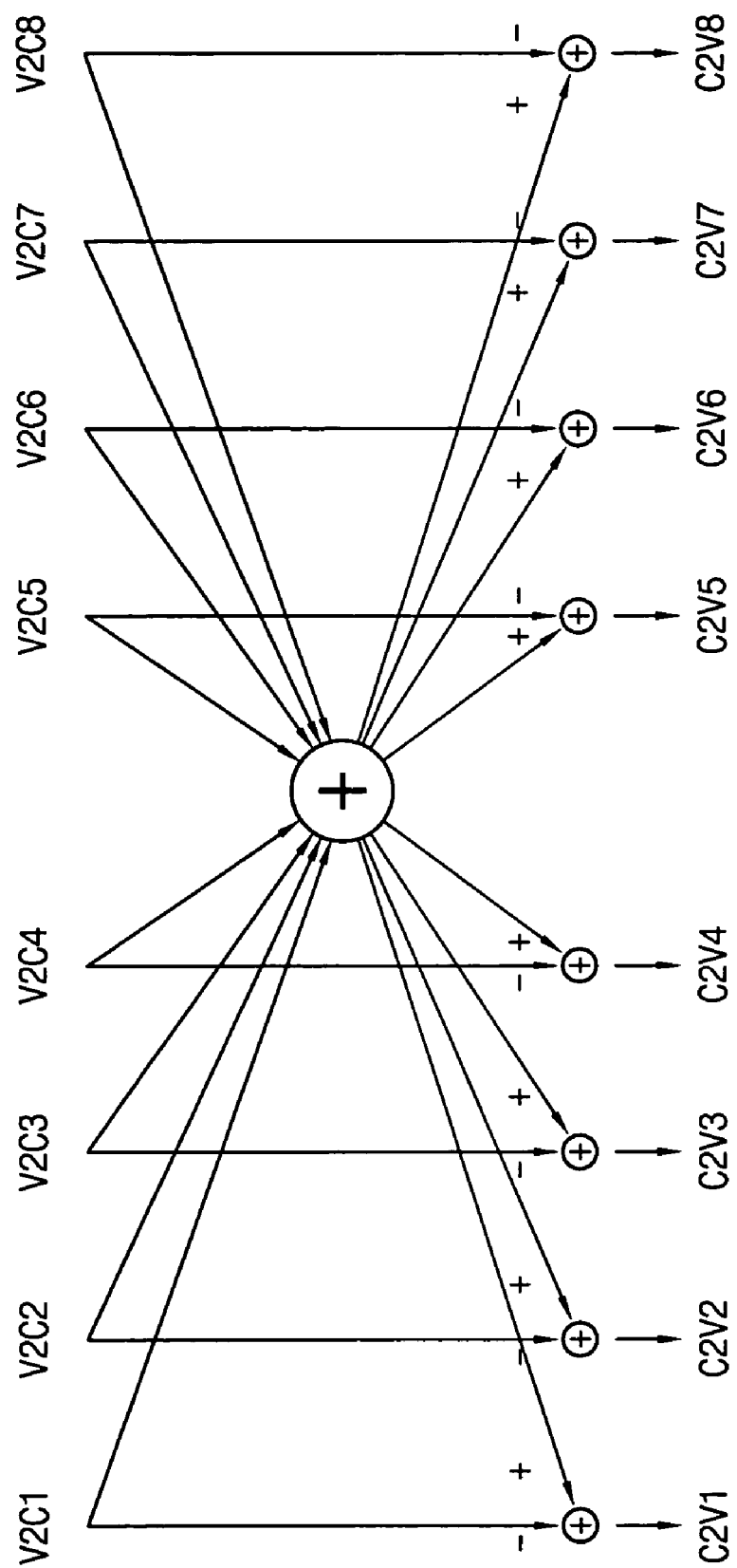

FIGS. 5 and 6 illustrate examples of check node magnitude and sign computation, respectively. Input edge values V2C1, V2C2, ..., V2C8 from variable nodes are processed according to a function φ( ), producing values that are summed. The sum is selectively combined with various ones of the values produced from the input edge values V2C1, V2C2, ..., V2C8 and processed according to an inverse function φ$^{-1}$( ), producing magnitude output edge values C2V1, C2V2, ..., C2V8 that are passed to variable nodes. Referring to FIG. 6, the input edge values V2C1, V2C2, ..., V2C8 from variable nodes are summed, and the sum thus produced is selectively combined with various ones of the input edge values V2C1, V2C2, ..., V2C8 to produce output sign edge values C2V1, C2V2, ..., C2V8 that are passed to variable nodes.

According to some embodiments of the present invention, improved efficiency in node processing operations, such as operations including variable and check node computations along the lines illustrated in FIGS. 4-6, may be achieved by simultaneously accessing (reading and/or writing) multiple memory locations assigned to edge values (e.g., the edge values V2C1, V2C2, ..., V2C8 described above with reference to FIG. 4) for node processing operations. For example, in certain embodiments of the present invention, this may be achieved by using a memory configured to enable simultaneous access to a plurality of memory locations. Such a memory may include respective simultaneously accessible memory units assigned to respective groups of edges such that edge values for a particular processing node may be simultaneously accessed by simultaneously accessing a plurality of the independently addressable memory units. It will be appreciated that the invention encompasses optimal solutions, e.g., solutions in which maximal simultaneity (or parallelism) in memory accesses is achieved, as well as suboptimal solutions, e.g., solutions in which less than maximal simultaneity in memory accesses is achieved.

Figure 7A:
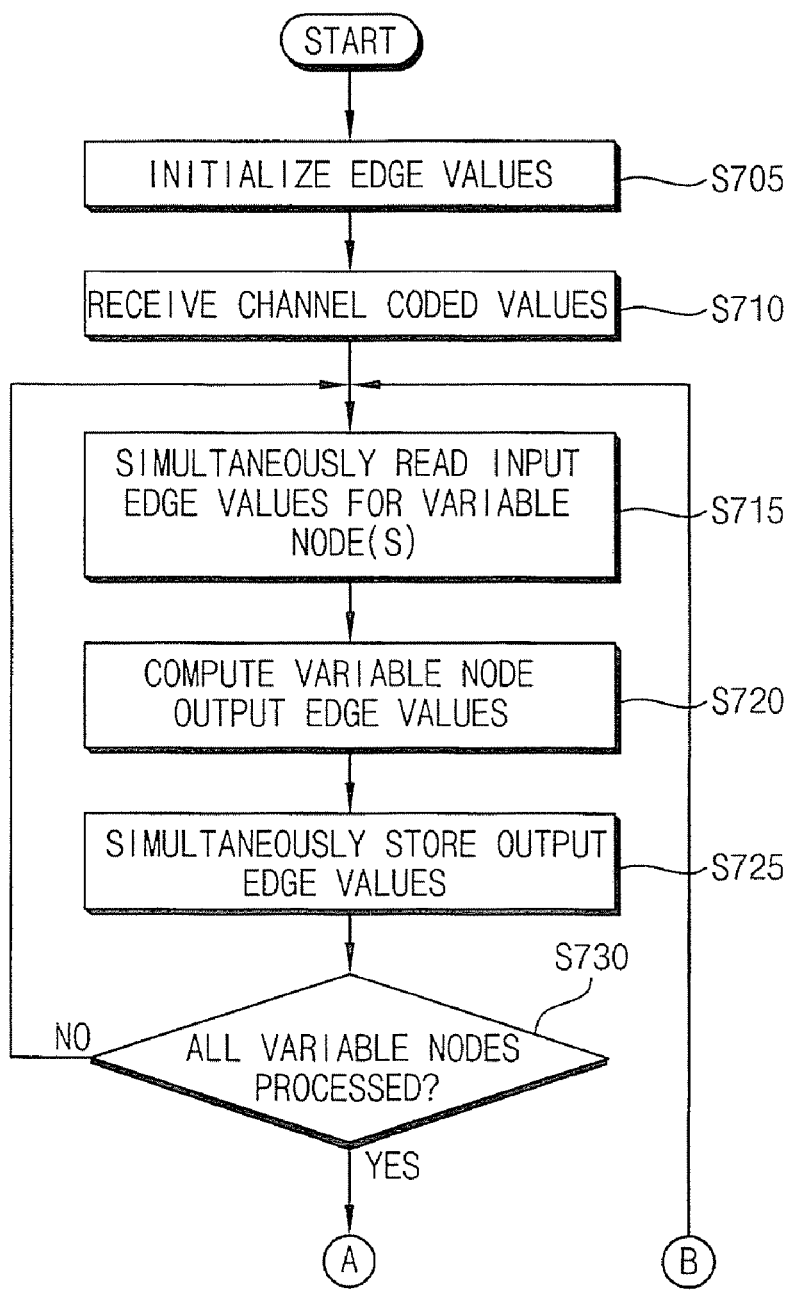
FIG. 7 is a flowchart illustrating exemplary decoding operations according to some embodiments of the present invention.
Figure 7B:
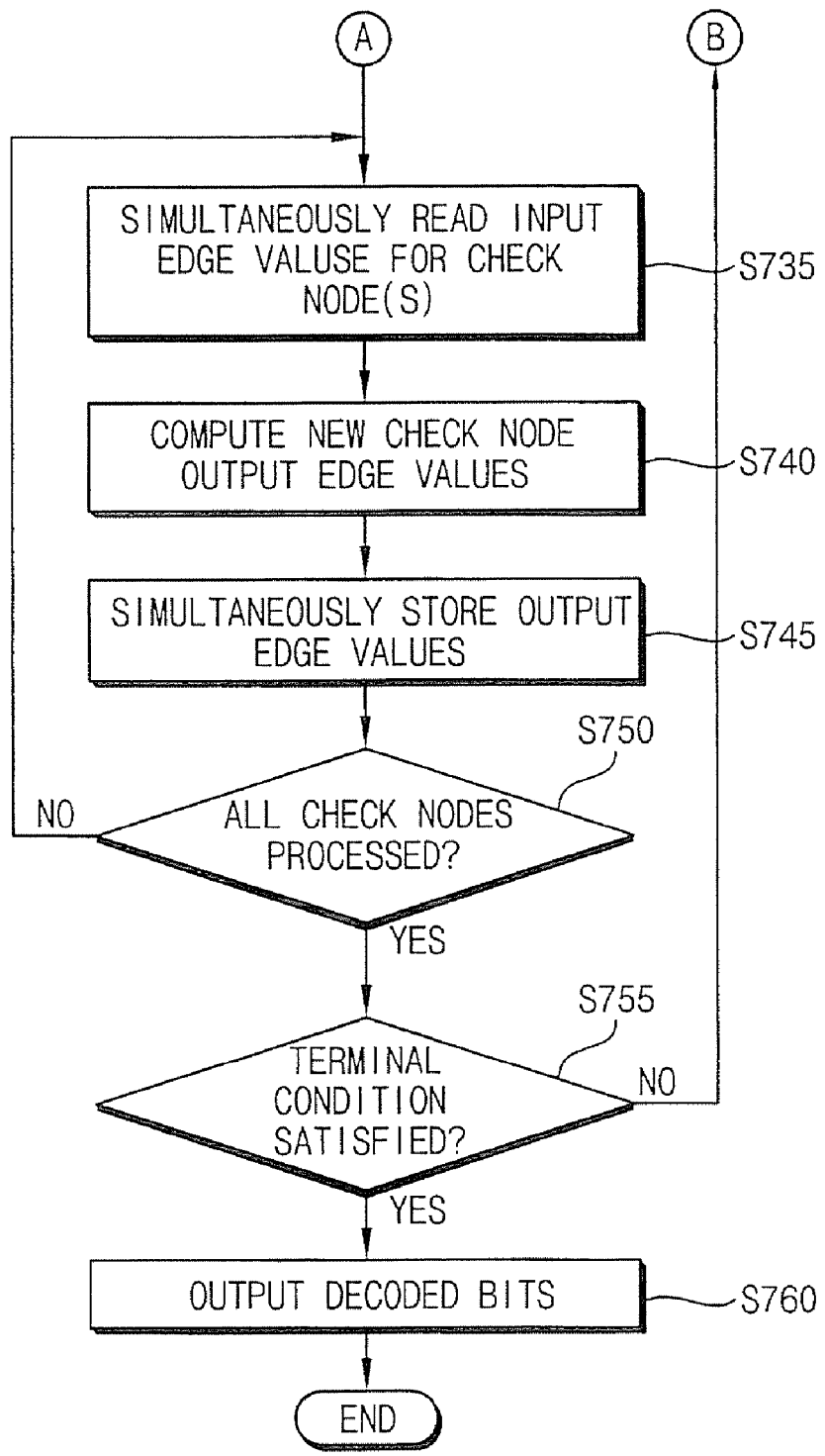

FIG. 7 illustrates exemplary operations according to some embodiments of the present invention. Input edge values for a plurality of variable nodes are initialized (block 705) and coded values are received from, for example, a demodulator (block 710). Entering a round of variable node processing, multiple input edge values for one or more variable nodes are simultaneously retrieved from a memory (block 715) and used to compute output edge values, i.e., edge values to be passed to check nodes (block 720). The computations may be along lines such as those described above with reference to FIG. 4; it will be appreciated, however, that any of a number of different computations may be used. At least some of the multiple output edge values thus produced are simultaneously stored (block 725). If remaining variable nodes remain to be processed, these nodes are processed as described above to produce and store additional output edge values (blocks 730 and 715-725).

Once all variable nodes have been processed, a similar iterative loop is performed for check nodes. In particular, input edge values for one or more check nodes, i.e., output edge values that were generated in the prior variable node processing (blocks 715-725), are simultaneously read (block 735) and used to compute output edge values that may be used for subsequent variable node processing (block 740). The computations may be along lines such as those described with reference to FIGS. 5 and 6, or may involve any of a number of other computations. At least some of these output edge values are simultaneously stored (block 745). If further check nodes remain to be processed, these nodes are processed as described above (blocks 750 and 735-745).

Upon completion of this round of check node processing, if a terminal condition, e.g., a condition based on the computed check node output values, is satisfied, decoded bits are output (block 760). However, if the terminal condition is not satisfied, another round of node processing is initiated, starting with variable node processing (blocks 715-725).

Figure 8:
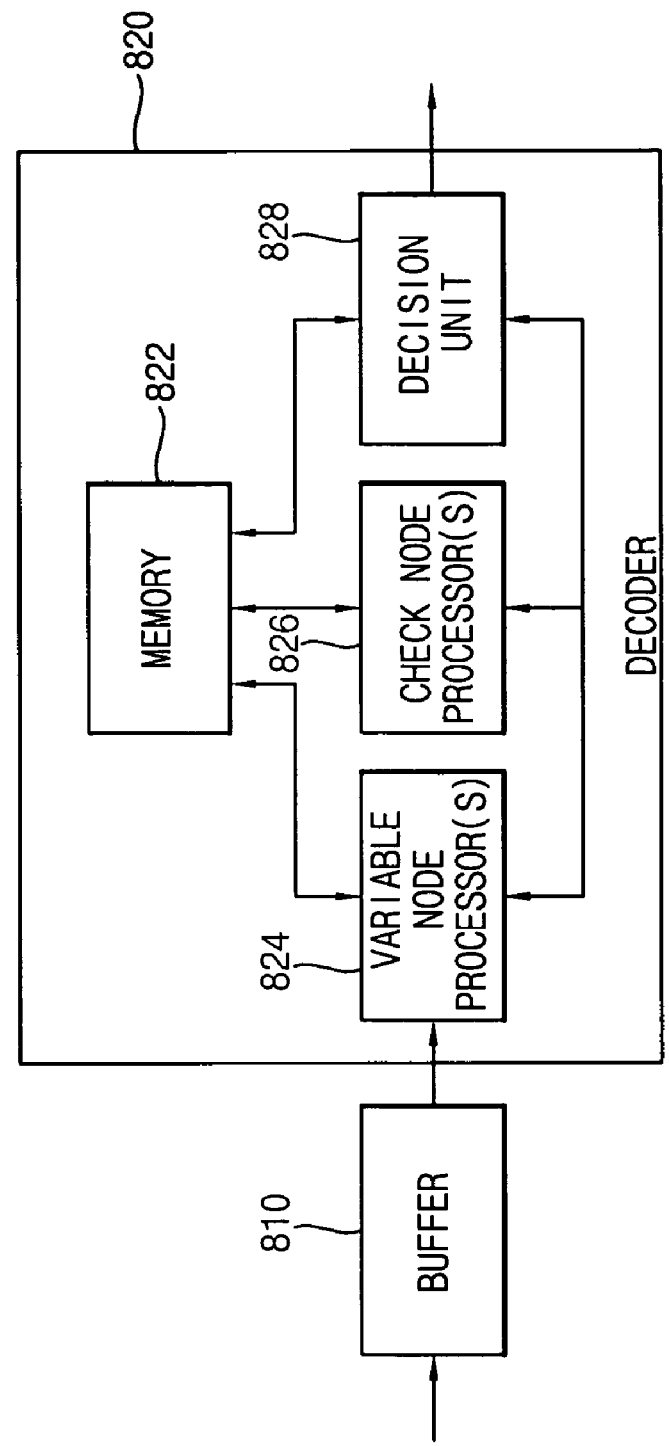
FIG. 8 is a block diagram illustrating a decoder configuration according to further embodiments of the present invention.

FIG. 8 illustrates apparatus in which operations along the lines described above with reference to FIG. 7 may be implemented. A decoder 820 includes one or more variable node processors 824, one or more check node processors 826, a decision unit 828 and a multi-access memory 822. In particular, the memory 822 is configured to support simultaneous access (i.e., multiple simultaneous reads and/or writes) to multiple memory locations assigned to edge values. The one or more variable node processors 824 are configured to receive coded values from a buffer 810, to simultaneously retrieve input edge values from the memory 822 for variable node processing operations for one or more nodes and to compute and simultaneously output edge values to the memory 822 as shown, for example, in blocks 715-730 of FIG. 7. Similarly, the one or more check node processors 826 are configured to simultaneously input edge values for one or more check nodes and to compute and simultaneously output edge values to the memory 822 as shown, for example, in blocks 735-745 of FIG. 7. The decision unit 828 may be configured to evaluate terminal conditions for iterative operations of the variable node and check node processors 824, 826, to responsively control the variable node and check node processors 824, 826, and to output decoded bits produced thereby.

Figure 9:
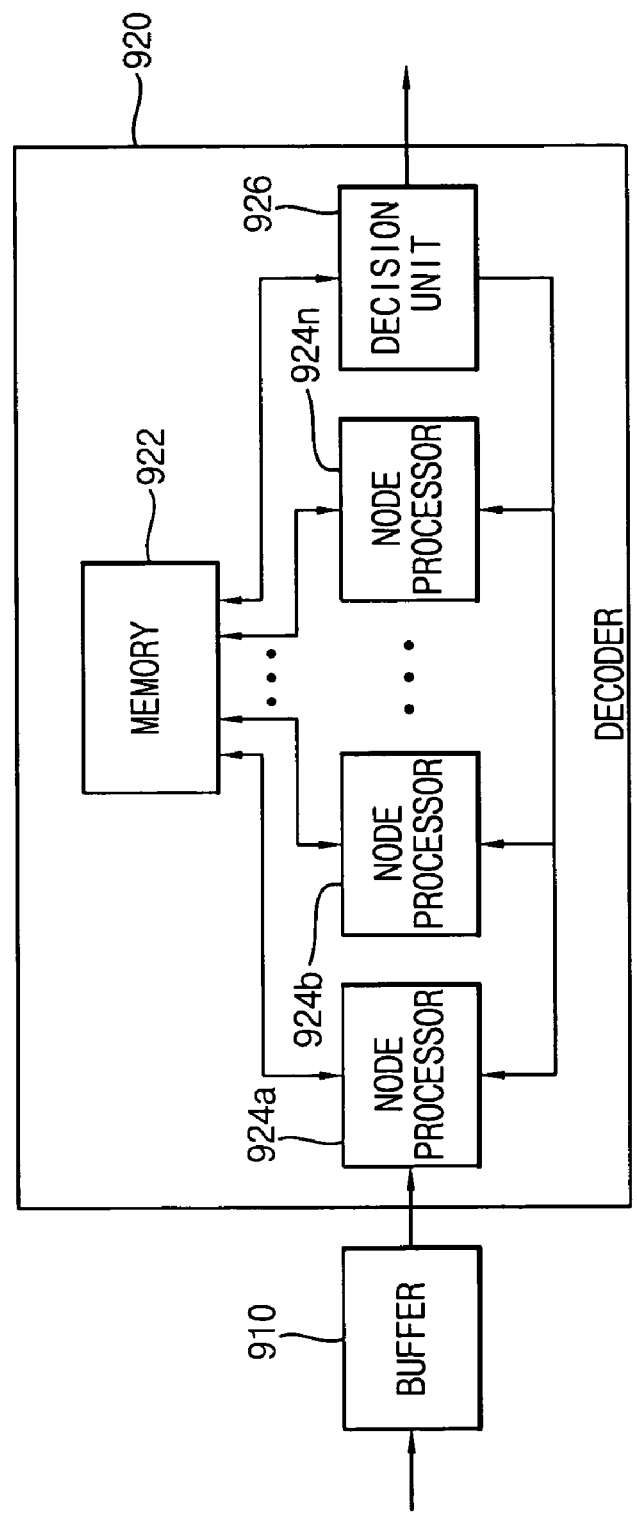
FIG. 9 is a block diagram illustrating a decoder configuration according to additional embodiments of the present invention.

FIG. 9 illustrates another decoding apparatus configuration according to further embodiments of the present invention. A decoder 920 includes a plurality of node processors 924a, 924b, . . . , 924n that decode coded values retrieved from a buffer 810. The decoder 920 further includes a memory 922 that is configured to provide simultaneous access to a plurality of memory locations storing edge values for node processing operations of the node processors 924a, 924b, . . . , 924n. The node processors 924a, 924b, . . . , 924n may be configured or configurable to provide variable and/or check node processing operations. For example, respective groups of the processing nodes may be allocated to respective groups or variable and/or check nodes. This allocation may be fixed or user-configurable, e.g., the node processors 924a, 924b, . . . , 924n may be allocated differently depending on the particular code being applied. The decoder 920 further includes a decision unit 926 that, responsive to the memory 922, controls the node processors 924a, 924b, . . . , 924n.

It will be appreciated that the configuration shown in FIG. 9 may be used to implement operations along the lines described above with reference to FIG. 7. For example, respective groups of the node processors 924a, 924b, . . . , 924n could be assigned to variable and check nodes, and operated alternately as shown in FIG. 7. Alternatively, the node processors 924a, 924b, . . . , 924n could be alternately used to perform variable and check node computations, e.g., within a given round of processing, the processors 924a, 924b, . . . , 924n could be first configured to act as variable node processors and, then, following completion of variable node processing, reconfigured to performed check node processing.

Figure 10:
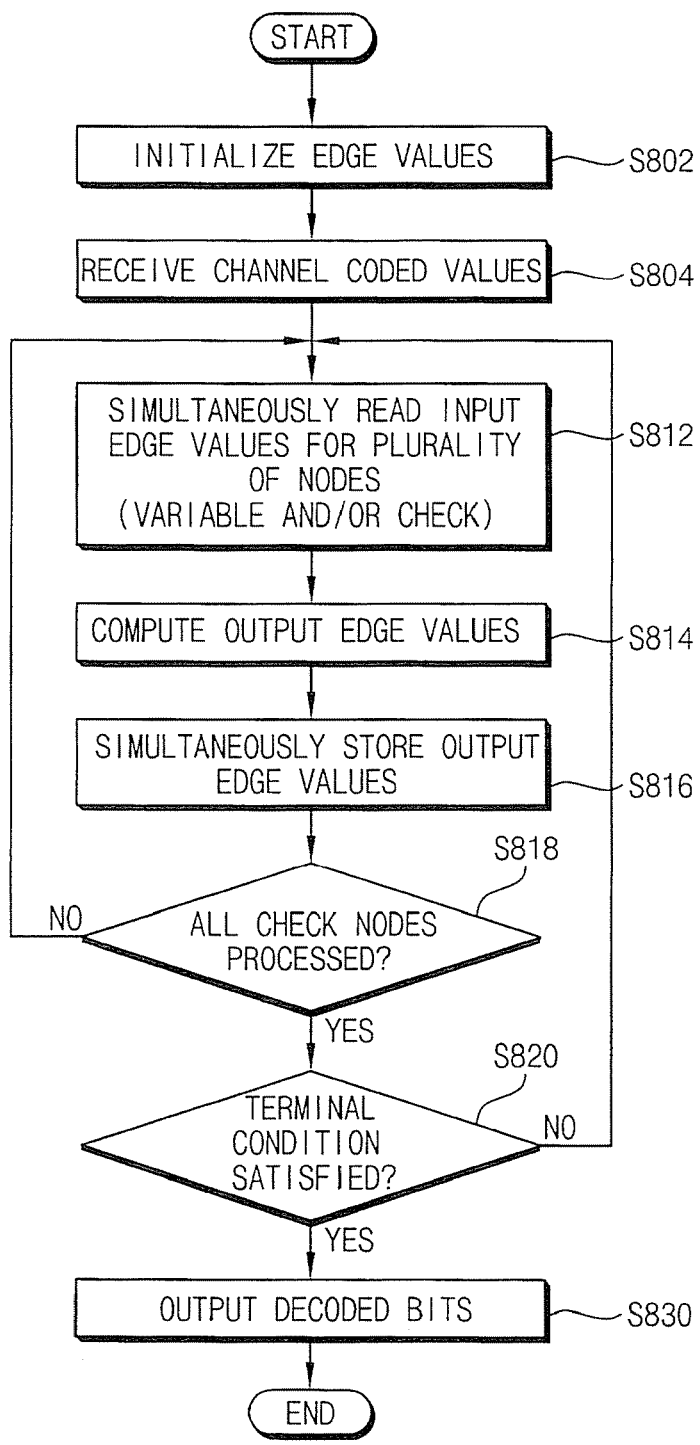
FIG. 10 is a flowchart illustrating exemplary decoding operations according to some embodiments of the present invention.

FIG. 10 illustrates further exemplary decoding operations that may be performed using a structure along the lines of FIG. 9 according to some embodiments of the present invention. Edge values are initialized (block 1005) and coded values are received (block 1010). Entering an iterative loop, input edge values for a plurality of processing nodes are read (block 1015) and used to compute output edge values (block 1020), which are simultaneously stored (block 1025). In particular, the plurality of nodes may comprise a plurality of variable nodes, check nodes or a combination thereof. The order in which variable nodes and check nodes are processed may be dependent upon the relationships among the nodes, i.e., the order in which edge values are computed may be based on when they may be used for subsequent computations. Upon completion of node processing for a particular round (block 1030), the decoder determines whether a terminal condition has been satisfied (block 1035). It so, the decoder outputs decoded bits (block 1040). If not, the decoder begins a new round of node processing operations (block 1015 et seq.).

Figure 11:
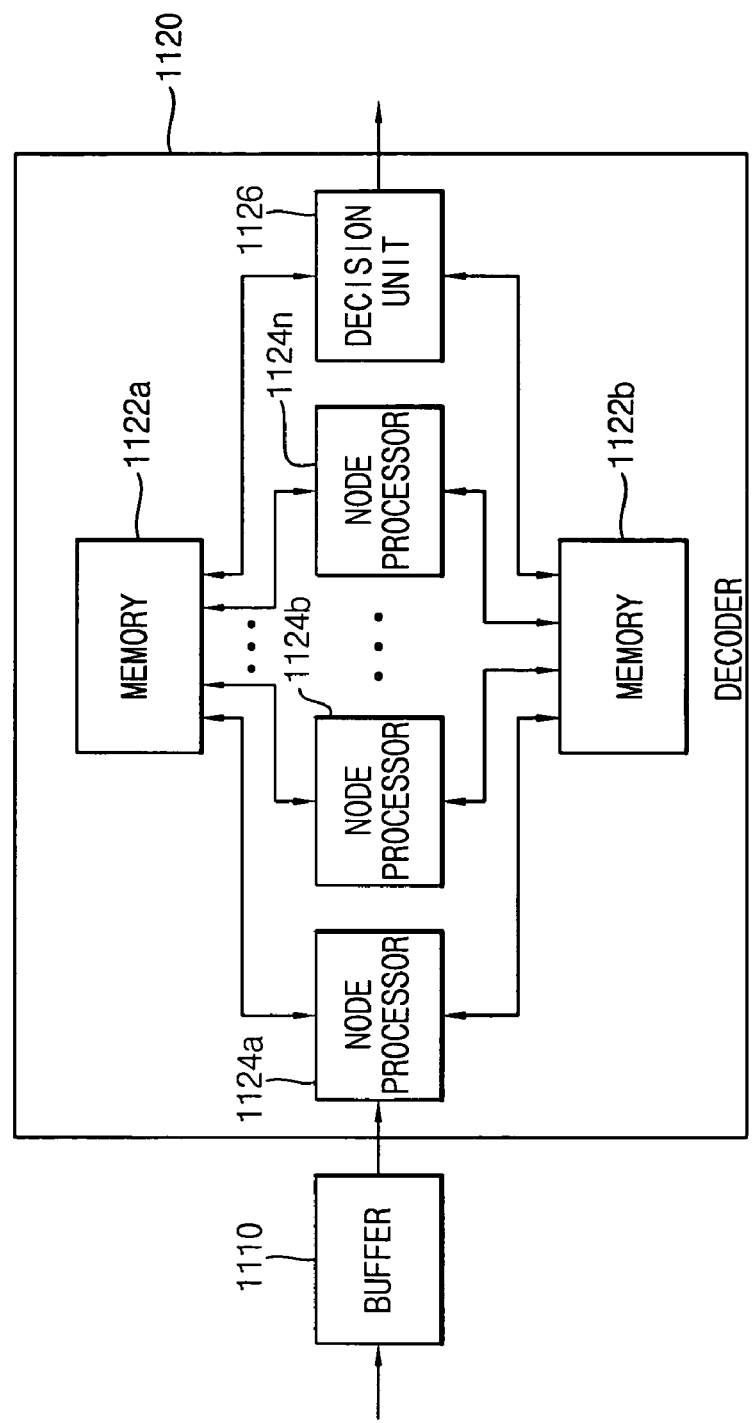
FIG. 11 is a block diagram illustrating a decoder configuration according to additional embodiments of the present invention.

FIG. 11 illustrates another decoder configuration according to further embodiments of the present invention. A decoder 1120 receives coded values from a buffer 1110. The decoder 1120 includes a first memory 1122a that is configured to store variable node input/check node output edge values and a second memory 1122b that is configured to store variable node output/check node input values. Node processors 1124a, 1124b, . . . , 1124n are configured to simultaneously access plural edge values storage locations in the memories 1122a, 1122b. The decoder 1120 further includes a decision unit 1126 that, responsive to the memories 1122a, 1122b, controls the node processors 1124a, 1124b, . . . , 1124n. This configuration can provide additional parallelism in node processing.

Figure 12:
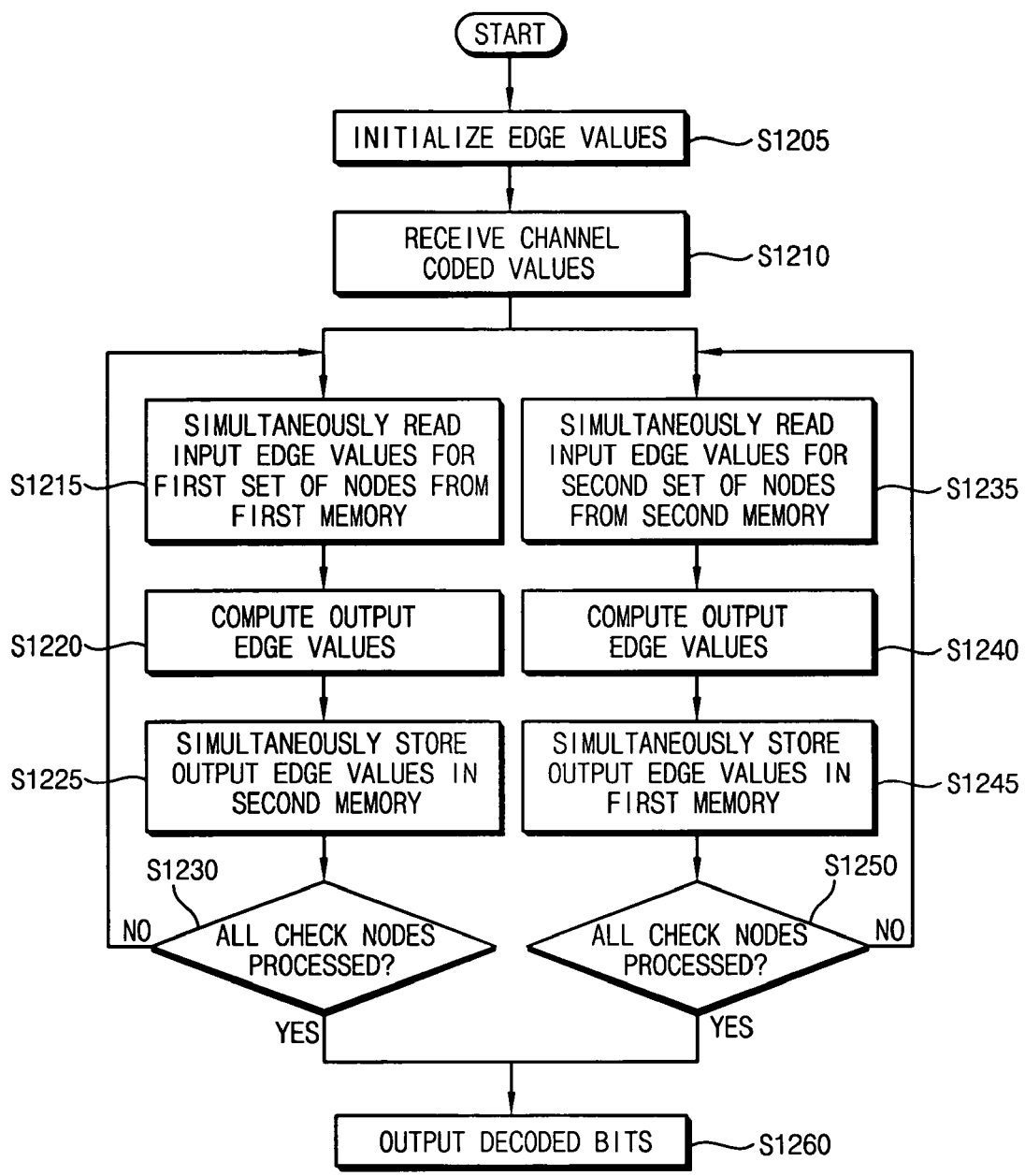
FIG. 12 is a flowchart illustrating exemplary decoding operations according to further embodiments of the present invention.

FIG. 12 illustrates exemplary node processing operations that may be performed using a computational structure such as that shown in FIG. 11. Edge values are initialized (block 1205) and coded values received (block 1210). Two iterative node processing procedures may proceed in parallel. In a first loop, input edge values for a first group of nodes are simultaneously read from a first memory (block 1215) and used to compute output edge values (block 1220), at least some of which are simultaneously written to a second memory (block 1225). These operations are repeated until all of nodes in the first set of nodes are processed (blocks 1230, 1215-1225). In a parallel second loop, input edge values for a second group of nodes are simultaneously read from the first memory (block 1235) and used to compute output edge values (block 1240) that are then simultaneously written to the first memory (block 1245). These operations are repeated until all of the second set of nodes are processed (blocks 1250, 1235-1245). It will be appreciated that, during execution of the loops, edge values computed by one loop may be used as input edge values to the parallel-executing loop. Upon satisfaction of a terminal condition (block 1255), the loops are terminated, and decoded bits output (block 1260).

It will be appreciated that simultaneous accessibility in a memory may be provided in a number of different ways. For example, a memory may include comprise independently controllable (e.g., independently addressable) memory units that can be simultaneously accessed.

Figure 13:
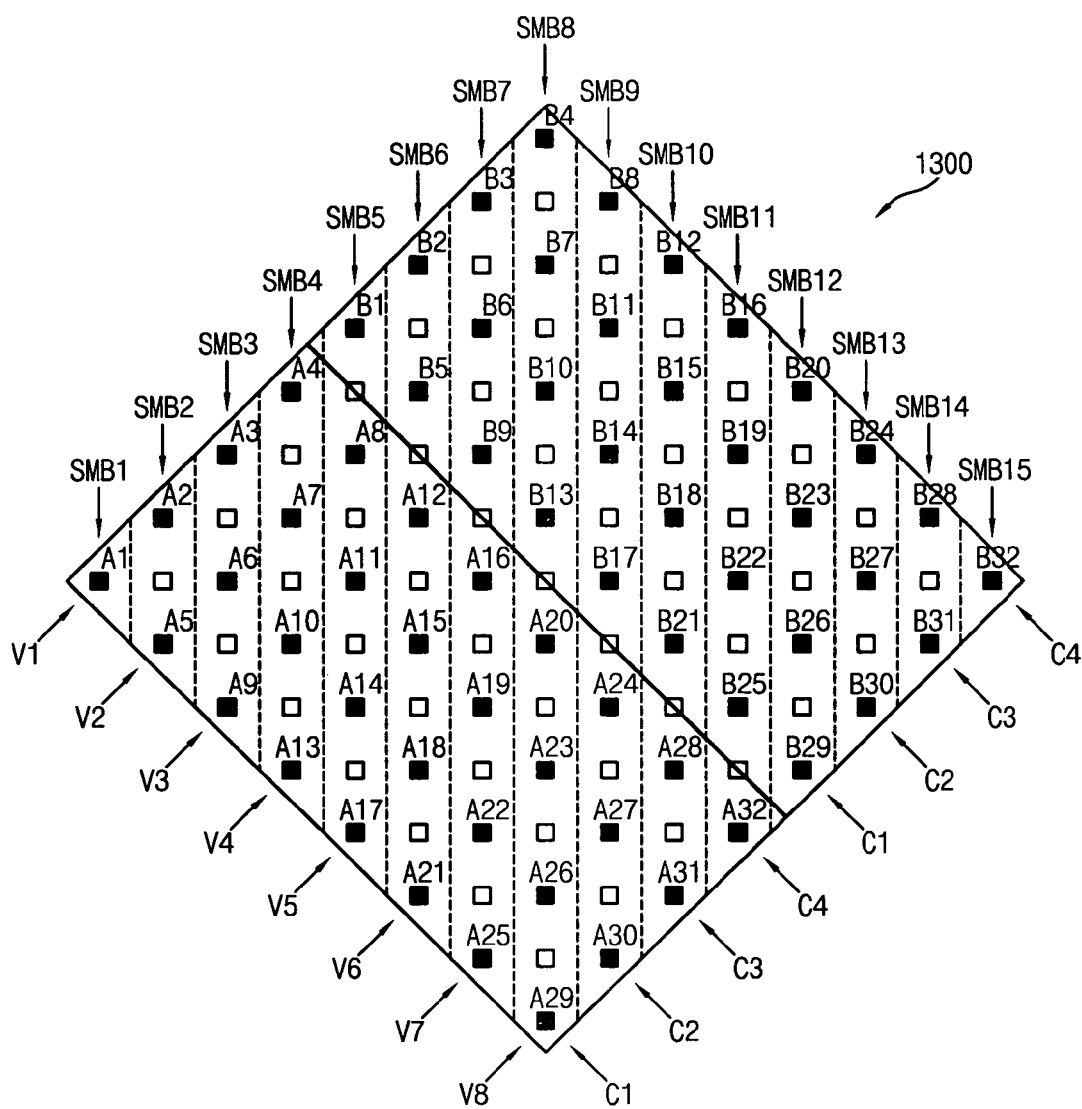

FIGS. 13-16 illustrate exemplary memory arrangements that may be used in various embodiments of the present invention. In particular, FIG. 13 illustrates memory 1300 configured for decoding operations for the code illustrated in FIG. 1. Referring to FIG. 13, the memory 1300 is divided into a plurality of simultaneously accessible blocks SMB1, SMB2, . . . , SMB15. Memory locations A1, A2, . . . , A32 and B1, B2, . . . , B32 are used to store edge values. Edge values corresponding to variable nodes V1, V2, . . . , V8 and to check nodes C1, C2, C3, C4 are stored as indicated by the arrows. Thus, for example, to compute output edge values for variable node V1, blocks SMB1 and SMB3 are simultaneously read to retrieve input edge values corresponding to check nodes C1 and C3 from locations A1 and A3, respectively. The computed output edge values for variable node V1 are then simultaneously written to locations B1 and B3 in blocks SMB5 and SMB7, respectively, which are input edge storage locations for check nodes C1 and C3. For check node C1, input edge values are simultaneously read from locations B1, B13, B17 and B29 in blocks SMB5, SMB8, SMB9 and SMB12, respectively.

Figure 14:
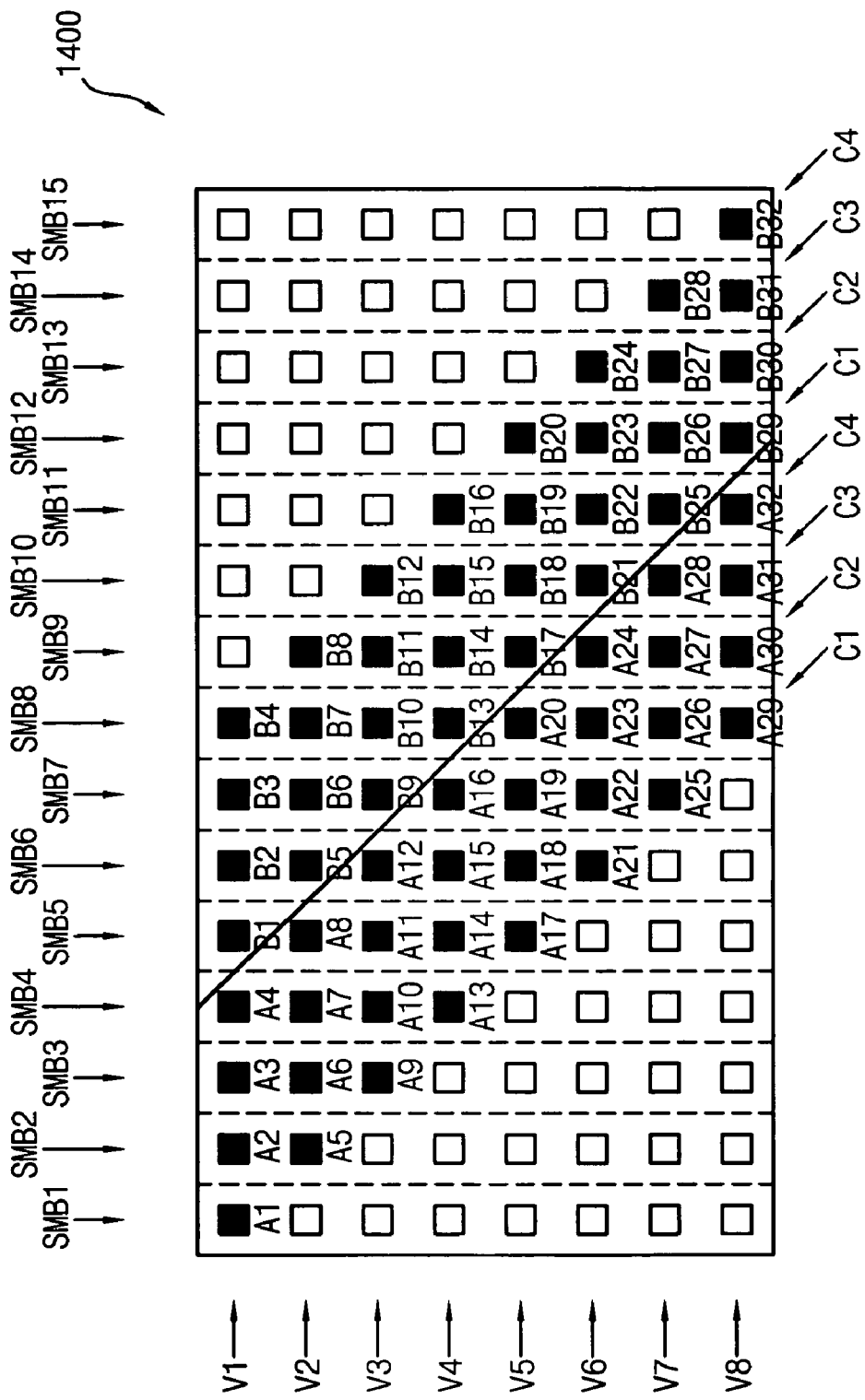
FIGS. 14-16 are schematic diagrams illustrating exemplary memory configurations according to some embodiments of the present invention.

FIG. 14 illustrates another exemplary memory configuration in accordance with further embodiments of the present invention. A memory 1400 includes a plurality of simultaneously accessible memory blocks SMB1, SMB2, . . . , SMB15. Memory locations A1, A2, . . . , A32 and B1, b2, . . . , B32 are used to store edge values. Edge values corresponding to variable nodes V1, V2, . . . , V8 and to check nodes C1, C2, C3, C4 are stored as indicated by the arrows. Thus, for example, to compute output edge values for variable node V1, blocks SMB1 and SMB3 are simultaneously read to retrieve input edge values corresponding to check nodes C1 and C3 from locations A1 and A3, respectively. The computed output edge values for variable node V1 are then simultaneously written to locations B1 and B3 in blocks SMB5 and SMB7, respectively, which are input edge storage locations for check nodes C1 and C3. For check node C1, input edge values are simultaneously read from locations B1, B13, B17 and B29 in blocks SMB5, SMB8, SMB9 and SMB12, respectively. It will be appreciated that the memory arrangement of FIG. 14 may be less space-efficient than that shown in FIG. 13.

Figure 15:
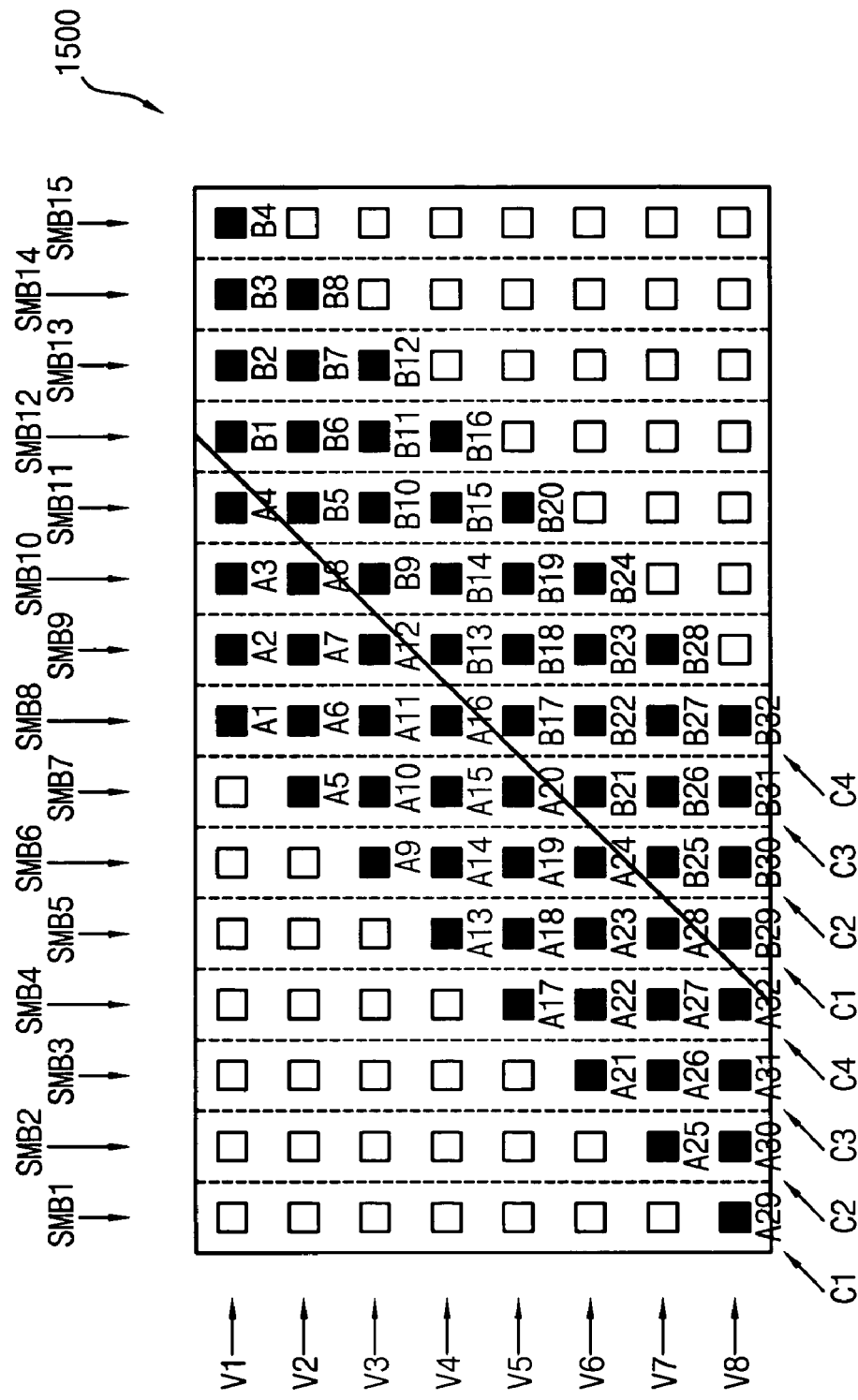

FIG. 15 illustrates yet another memory configuration according to further embodiments of the present invention. A memory 1500 includes a plurality of simultaneously accessible memory blocks SMB1, SMB2, ..., SMB15. Memory locations A1, A2, ..., A32 and B1, B2, ..., B32 are used to store edge values. Edge values corresponding to variable nodes V1, V2, ..., V8 and to check nodes C1, C2, C3, C4 are stored as indicated by the arrows. Thus, for example, to compute output edge values for variable node V1, blocks SMB8 and SMB10 are simultaneously read to retrieve input edge values corresponding to check nodes C1 and C3 from locations A1 and A3, respectively. The computed output edge values for variable node V1 are then simultaneously written to locations B1 and B3 in blocks SMB12 and SMB14, respectively, which are input edge storage locations for check nodes C1 and C3. For check node C1, input edge values are simultaneously read from locations B1, B13, B17 and B29 in blocks SMB12, SMB9, SMB8 and SMB5, respectively. It will be appreciated that this configuration can provide space utilization equivalent to that of the configuration of FIG. 14.

Figure 16:
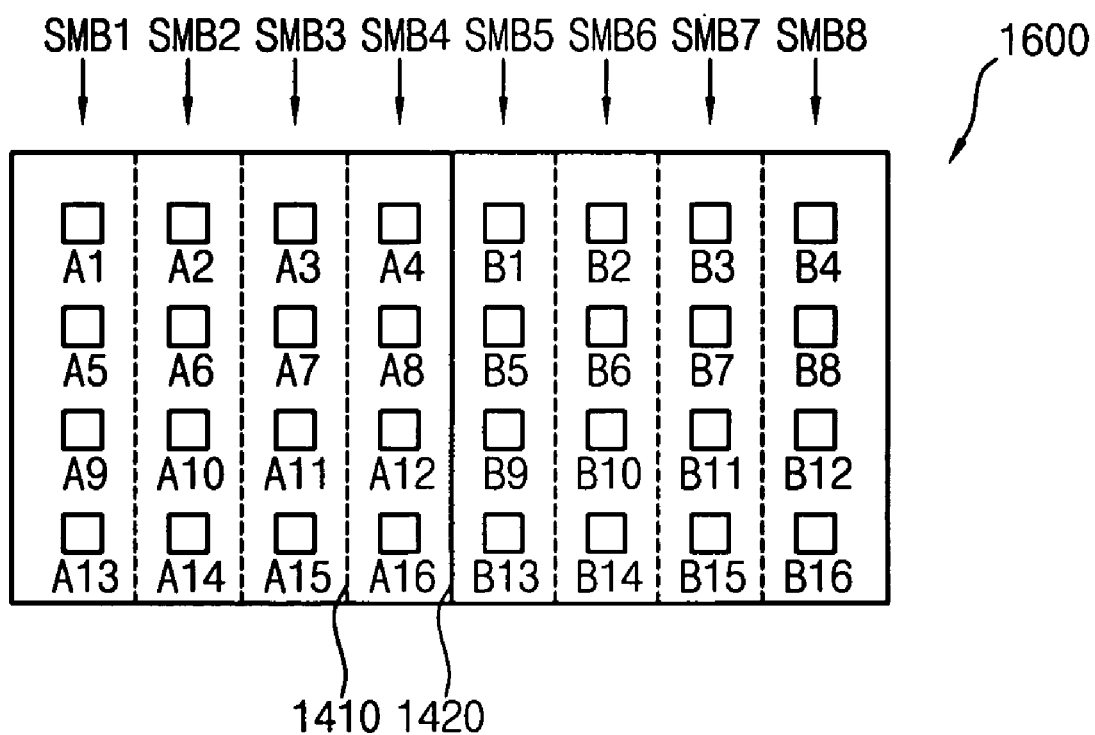

FIG. 16 illustrates another exemplary memory configuration according to additional embodiments of the present invention. A memory 1600 includes a plurality of simultaneously accessible blocks SMB1, SMB2, ..., SMB8. Memory locations A1, A2, ..., A16 and B1, B2, ..., B16 are used to store edge values, which correspond to the minimum number of memory locations (32) needed to store edge values for the bipartite graph of FIG. 1. The memory locations A1, A2, ..., A16 and B1, B2, ..., B16 may be heuristically assigned to edges to allow for simultaneous reading and/or writing for node processing. The heuristic arrangement may provide (e.g., to a point of optimization) a desired speed in memory accesses and/or space utilization of the memory 1600. It will be appreciated that optimal assignment of the memory locations A1, A2, ..., A16 and B1, B2, ..., B16 is generally dependent on the manner in which node processing is implemented and the structure of the code being applied. For example, processing according to the operations illustrated in FIG. 7 using a memory structure such as that shown in FIG. 16 may lead to a different optimal assignment of edges to the locations A1, A2, ..., A16 and B1, B2, ..., B16 than would be the case for a processing operations such as that shown in FIG. 10.

Figure 17:
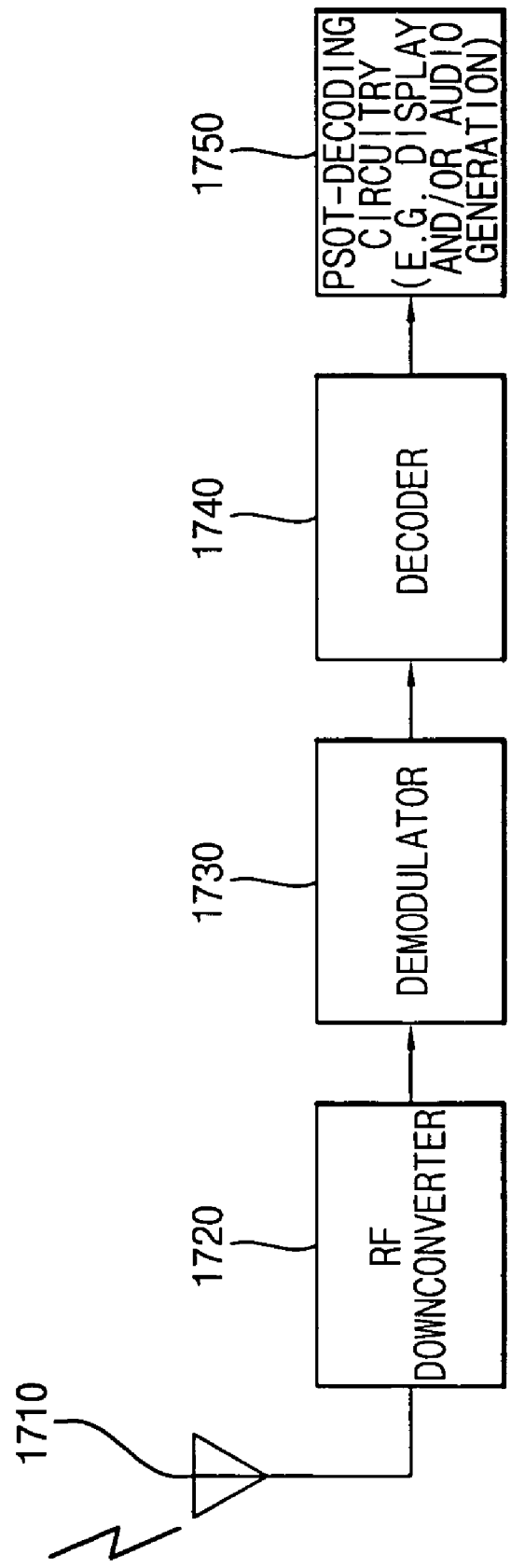
FIG. 17 is a schematic diagram illustrating a communication receiver according to further embodiments of the present invention.

FIG. 17 illustrates an exemplary application according to further embodiments of the present invention. A communications receiver 1700, for example, a wireless terminal or digital television terminal, receives a radio communications signal at an antenna 1710 thereof. A downconverter 1720 converts the received radio signal to an intermediate frequency (IF) signal that is demodulated by a demodulator 1730 to produce a baseband signal. It will be appreciated that the baseband signal may be coded according to an error correction code, such as an LDPC code. A decoder 1740 operating according to embodiments of the present invention decodes the baseband signal to produce a decoded signal, which may be further processed in post-decoding circuitry 1750 to produce, for example, an audio and/or video output. It will be appreciated that the decoder 1740 may, for example, perform operations as described above with reference to FIGS. 7-16. It will be further appreciated that, although FIG. 17 illustrates application of embodiments of the present invention in wireless communications, the present invention is also application to other communications applications, such as wireline and optical communications and data storage and retrieval.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. It is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A decoding method comprising:
    assigning respective memory locations for respective edges linking processing nodes of a decoder comprising a plurality of processing nodes; and
    applying the decoder to a coded input signal to generate a decoded output signal, including iteratively retrieving edge values from and providing edge values to the memory locations such that multiple ones of the memory locations are simultaneously accessed in a processing node operation,
    wherein iteratively retrieving edge values from and providing edge values to the memory locations comprises:
    simultaneously reading a plurality of edge values for a processing node from a first plurality of the memory locations;
    computing a plurality of edge values for the processing node from the plurality of read edge values; and
    simultaneously writing the plurality of computed edge values to a second plurality of memory locations.

2. The method of claim 1, wherein the processing nodes comprise variable nodes and check nodes, and wherein the edges comprise edges linking the variable and check nodes.

3. The method of claim 2, wherein applying the decoder to a coded input signal comprises alternately performing variable and check node operations in respective first and second processors.

4. The method of claim 2, wherein applying the decoder to a coded input signal comprises:
    configuring at least one processor to perform a variable node operation;
    computing variable node output edge values using the at least one processor;
    reconfiguring the at least one processor to perform a check node operation; and
    computing check node output edge values using the at least one processor.

5. The method of claim 2;
    wherein assigning respective memory locations to respective edges linking the variable and check nodes comprises assigning a first plurality of memory locations to variable node-to-check node edges and a second plurality of memory locations to check node-to-variable node edges; and
    wherein applying the decoder comprises simultaneously performing variable node and check node operations in respective first and second processors and storing edge values thereby produced in the respective first and second pluralities of memory locations.

6. The method of claim 2, wherein the variable and check nodes are functionally related according to a parity check matrix.

7. The method of claim 6, wherein the parity check matrix corresponds to a low density parity check code.

8. The method of claim 1, wherein assigning respective memory locations to respective edges linking the processing nodes comprises assigning respective simultaneously accessible memory units to respective groups of the edges such that edge values for a particular processing node are simultaneously accessed by simultaneously accessing a plurality of the simultaneously accessible memory units.

9. The method of claim 8, wherein each of the simultaneously accessible memory units comprises a plurality of memory locations that are accessed in respective different processing node operations.

10. The method of claim 1, wherein applying the decoder to a coded input signal to generate a decoded output signal is preceded by:

receiving a signal from a communications medium; and processing the received signal to generate the coded input signal.

11. A computer program product embodied on a computer-readable medium and comprising program code that when executed, causes a computer to perform the following:

defining a decoder comprising a plurality of processing nodes, assigning respective memory locations for respective edges linking the processing nodes, and applying the decoder to a coded input signal to generate a decoded output signal by iteratively retrieving edge values from and providing edge values to the memory locations for operations of the processing nodes such that multiple ones of the memory locations are simultaneously accessed in a processing node operation, wherein iteratively retrieving edge values from and providing edge values to the memory locations comprises:

simultaneously reading a plurality of edge values for a processing node from a first plurality of the memory locations;

computing a plurality of edge values for the processing node from the plurality of read edge values; and simultaneously writing the plurality of computed edge values to a second plurality of memory locations.

12. The computer program product of claim 11, wherein the processing nodes comprise variable nodes and check nodes, and wherein the edges comprise edges linking the variable and check nodes.

13. The computer program product of claim 12, wherein the program code is configured to cause respective first and second processors to alternately perform variable and check node operations.

14. The computer program product of claim 12, wherein the program code is configured to configure at least one processor to perform a variable node operation, to compute variable node output edge values using the at least one processor, to reconfigure the at least one processor to perform a check node operation and to compute check node output edge values using the at least one processor.

15. The computer program product of claim 12, wherein the program code is configured to assign the first plurality of memory locations to variable node-to-check node edges and the second plurality of memory locations to check node-to-variable node edges, and to simultaneously perform variable node and check node operations in respective first and second processors and store edge values thereby produced in the respective first and second pluralities of memory locations.

16. The computer program product of claim 11, wherein the program code is configured to assign respective simultaneously accessible memory units to respective groups of the edges such that edge values for a particular processing node are simultaneously accessed by simultaneously accessing a plurality of the simultaneously accessible memory units.

17. The computer program product claim 16, wherein each of the simultaneously accessible memory units comprises a plurality of memory locations that are accessed in respective different processing node operations.

* * * * *